(12) United States Patent
Lee

(10) Patent No.: US 7,492,623 B2
(45) Date of Patent: Feb. 17, 2009

(54) OPTION CIRCUITS AND OPTION METHODS OF SEMICONDUCTOR CHIPS

(75) Inventor: Jae-Hyung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 11/655,966

(22) Filed: Jan. 22, 2007

(65) Prior Publication Data
US 2007/0183180 A1 Aug. 9, 2007

(30) Foreign Application Priority Data
Jan. 23, 2006 (KR) .................. 10-2006-0006667

(51) Int. Cl.
*G11C 17/00* (2006.01)
(52) U.S. Cl. .................. 365/96; 365/225.7; 365/240
(58) Field of Classification Search .............. 365/96, 365/225.7, 240; 257/200
See application file for complete search history.

(56) References Cited

U.S. PATENT DOCUMENTS 7,173,469 B1 * 2/2007 Rezeanu .................. 327/291
7,298,639 B2 * 11/2007 Hsu et al. .................. 365/96
2001/0035536 A1 11/2001 Muller
2001/0035537 A1 * 11/2001 Shinozaki .................. 257/200

FOREIGN PATENT DOCUMENTS

JP 2004-071099 3/2004
KR 1020050052850 A 6/2005

* cited by examiner

*Primary Examiner*—Huan Hoang
*Assistant Examiner*—Fernando N Hidalgo
(74) *Attorney, Agent, or Firm*—Harness, Dickey, & Pierce

(57) ABSTRACT

An option circuit of a semiconductor chip includes a first option circuit that is set before packaging the semiconductor chip to generate a first option signal; a second option circuit that is set after packaging the semiconductor chip to generate a second option signal; and a selection circuit configured to: select one of the first option signal, the second option signal, and a mode register set signal in response to at least one first control signal; and output a first selected signal as a final option signal. An option method of a semiconductor chip includes setting a first option mode of the semiconductor chip by use of the first option circuit; setting a second option mode of the semiconductor chip by use of the second option circuit; and determining a final option mode of the semiconductor chip by selection of the first option mode or the second option mode.

11 Claims, 3 Drawing Sheets

FIG.3A

| CON1 | CON2 | OPTION STATE |
|---|---|---|
| L | L | FUSE |
| L | H | FUSE, SOLDERING, OR E-FUSE |
| H | L | FUSE |
| H | H | MRS1 |

FIG.3B

| XOR1 | CON1 | CON2 | OPTION STATE |
|---|---|---|---|
| WOP1 | L | L | FUSE |
| WOP1 | L | H | FUSE |
| WOP1 | H | L | FUSE |
| WOP1 | H | H | MRS1 |
| POP1 | L | L | FUSE |
| POP1 | L | H | SOLDERING OR E-FUSE |
| POP1 | H | L | FUSE |
| POP1 | H | H | MRS1 |

OPTION CIRCUITS AND OPTION METHODS OF SEMICONDUCTOR CHIPS

PRIORITY STATEMENT

This application claims priority from Korean Patent Application No. 10-2006-0006667, filed on Jan. 23, 2006, in the Korean Intellectual Property Office (KIPO), the entire contents of which are incorporated herein by reference.

BACKGROUND

1. Field

Example embodiments relate to setting parameters in semiconductor chips. Also, example embodiments relate to option circuits and option methods of semiconductor chips, in which information such as operation parameters may be changed even after semiconductor packages have been assembled.

2. Description of Related Art

Generally, a semiconductor chip includes a fuse option circuit so that internal parameters of the semiconductor chip may be controlled in a wafer test process. The fuse option circuit may be programmed by laser-cutting in the wafer test process.

After a semiconductor device including the programmed semiconductor chip is packaged in a package assembly process, the semiconductor package is tested. A soldering option, an electrical fuse (e-fuse) option, a mode register set (MRS) option, etc., are provided for the semiconductor chip so that the internal parameters may be changed in the package test process.

The soldering option is difficult to implement because of space limitations of the semiconductor chip that are encountered as a number of pins increases. However, the soldering option has an advantage in that a signal of the semiconductor chip may be artificially changed by external manipulation so that an operation mode may be easily changed. That is, even though each of a plurality of semiconductor chips is packaged to have the same operation mode as one another, each of the semiconductor chips may be set to have a different operation mode from one another by the soldering option.

The fuse option, the e-fuse option, the soldering option, etc., may be referred to as hardware options that are used in mechanically or physically changing the options, while the MRS option may be referred to as a software option with which external test equipment sends commands to the semiconductor chip so that a mode register value in the semiconductor chip may be changed.

FIG. 1 is a circuit diagram illustrating a related art option method of a semiconductor chip.

Referring to FIG. 1, a register value is changed by multiplexing a signal outputted from a hardware option, such as a soldering option, an e-fuse option, a fuse option, etc., and a signal outputted from a software option, such as a MRS option.

In the related art option method, only one of the hardware options may be inputted to a multiplexer MUX. Then, either the inputted hardware option or the software option, but not both, is selected by applying a control signal CON to the multiplexer MUX. As a result, more than one of the hardware options may not be used at the same time.

Thus, for example, when fuse information needs changing after packaging a semiconductor chip, the fuse information may be changed by cutting a corresponding fuse only after the semiconductor package is disassembled. That is, the fuse information may not be changed without disassembling and then reassembling the semiconductor package.

In a mass-production test process for memory chips, environments in which a user may arbitrarily change test parameters are needed. For example, when the memory chips need to be tested with respective clock signals having duty ratios different from each other, an option program is needed in order to change the duty ratio of the clock signal.

However, the option program, such as a duty ratio, is set by a fuse option before packaging the semiconductor chip. Thus, after packaging the semiconductor chip, it is difficult to change parameters of the semiconductor chip that provide the clock signal to the memory chip to be tested. Therefore, a user has restrictions in managing the test because it may not be possible to perform the test with a variety of parameters.

SUMMARY

Example embodiments may provide option circuits of semiconductor chips, in which information may be changed according to a variety of conditions even after the semiconductor chips have been packaged.

Example embodiments also may provide option methods of semiconductor chips, in which information may be changed according to a variety of conditions even after the semiconductor chips have been packaged.

According to example embodiments, an option circuit of a semiconductor chip may include a first option circuit, a second option circuit, and/or a selection circuit. The first option circuit may be set before packaging the semiconductor chip and/or may generate a first option signal. The second option circuit may be set after packaging the semiconductor chip and/or may generate a second option signal. The selection circuit may select one of the first option signal, the second option signal, and/or a MRS signal in response to a control signal, and/or may be configured to output a first selected signal as a final option signal. The control signal may be provided by an external device such as a memory test apparatus.

The first option circuit may include a fuse option circuit, in which a fuse in the fuse option circuit may be cut by a laser before packaging the semiconductor chip. The second option circuit may include a soldering option circuit that may be set after packaging the semiconductor chip, an electrical fuse (e-fuse) option circuit that may be set after packaging the semiconductor chip, or a soldering option circuit and an e-fuse option circuit that may be set after packaging the semiconductor chip.

The selection circuit may include a logic circuit, a first selector, and/or a second selector. The logic circuit may, for example, choose between the first option signal and the second option signal or replace the first option signal with the second option signal. The first selector may be configured to select one of an output signal of the logic circuit and the MRS signal in response to at least one first control signal, and may be configured to output a second selected signal. The second selector may be configured to select one of the second selected signal and the first option signal, in response to at least one second control signal, and may be configured to output the first selected signal as the final option signal. The logic circuit may include an exclusive-OR gate.

The semiconductor chip may be configured to provide a clock signal and/or the option circuit may be included in the semiconductor chip to program a duty ratio of the clock signal.

According to example embodiments, in an option method of a semiconductor chip, a first option mode of the semiconductor chip may be set using a first option circuit before packaging the semiconductor chip. A second option mode of the semiconductor chip may be set using a second option circuit after packaging the semiconductor chip. A final option mode of the semiconductor chip may be determined by selecting one of the first option mode and the second option mode based on at least one control signal.

The first option mode may be set, for example, by laser-cutting the first option circuit in a wafer test process. The second option mode may be set by soldering an option pad in the second option circuit and/or cutting an electrical fuse in the second option circuit. Furthermore, the second option mode may be set by applying a MRS signal. Additionally, the second option mode may be set by soldering the option pad in the second option circuit and/or cutting the electrical fuse in the second option circuit and/or applying the MRS signal.

According to example embodiments, an option that may be set before packaging a semiconductor chip may be variously changed by programming an external control signal even after the semiconductor chip has been packaged.

BRIEF DESCRIPTION OF THE DRAWINGS

The above and/or other aspects and advantages will become more apparent and more readily appreciated from the following detailed description of example embodiments taken in conjunction with the accompanying drawings, in which:

FIG. 3A is a first example truth table showing option states according to the option circuit of FIG. 2;

FIG. 3B is a second example truth table showing option states according to the option circuit of FIG. 2.

DETAILED DESCRIPTION OF EXAMPLE EMBODIMENTS

Figure 1:
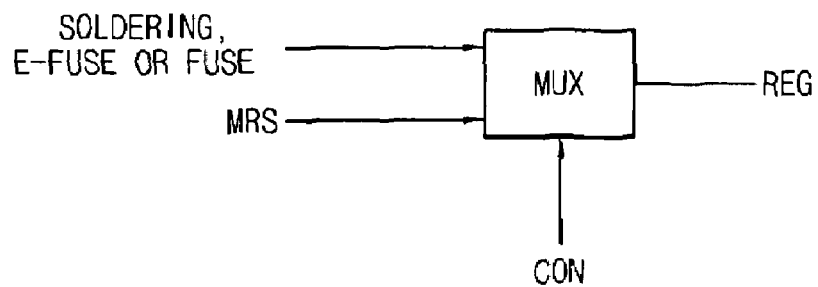
FIG. 1 is a circuit diagram illustrating a related art option method of a semiconductor chip.

Example embodiments will now be described more fully with reference to the accompanying drawings. Embodiments, however, may be embodied in many different forms and should not be construed as limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that, although the terms first, second, third, etc., may be used herein to describe various elements, components, regions, layers, and/or sections, these elements, components, regions, layers, and/or sections should not be limited by these terms. These terms are only used to distinguish one element component, region, layer, and/or section from another element, component, region, layer, and/or section. For example, a first element, component, region, layer, and/or section could be termed a second element, component, region, layer, and/or section without departing from the teachings of the example embodiments.

It will be understood that when an element is referred to as being "on," "connected to," or "coupled to" to another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
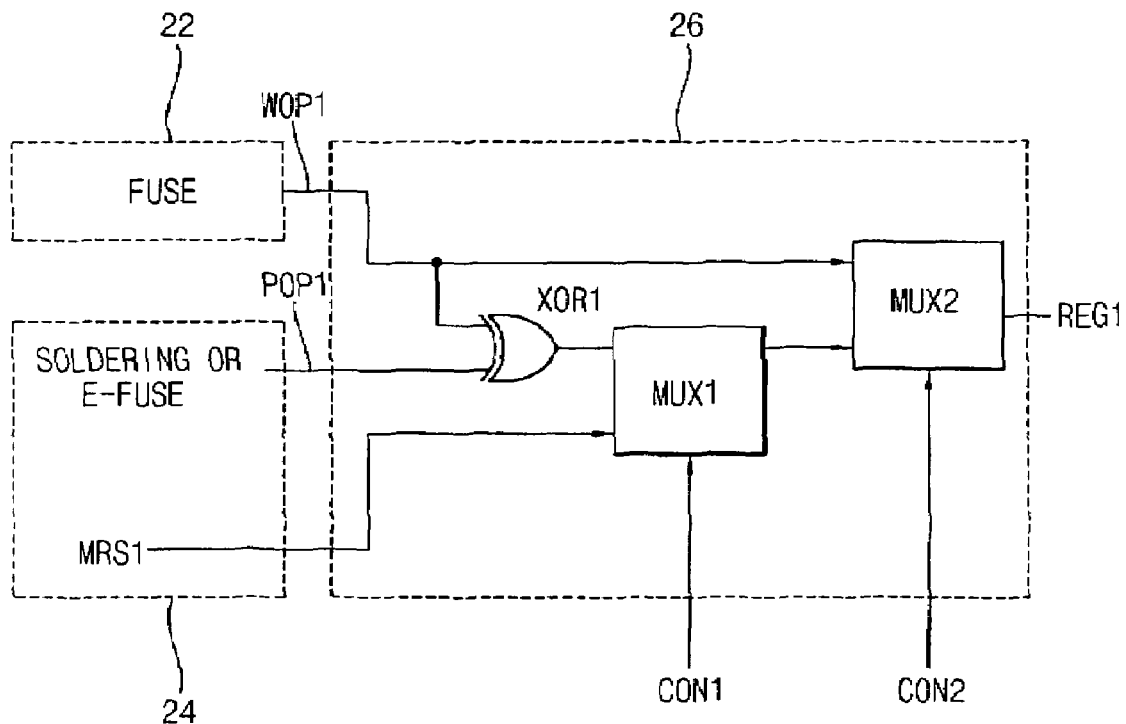
FIG. 2 is a block diagram illustrating an option circuit of a semiconductor chip according to example embodiments.

FIG. 2 is a block diagram illustrating an option circuit of a semiconductor chip according to example embodiments. FIG. 3A is a first example truth table showing option states according to the option circuit of FIG. 2. FIG. 3B is a second example truth table showing option states according to the option circuit of FIG. 2.

Referring to FIG. 2, the option circuit may include a first option circuit 22 that may be set before packaging the semiconductor chip, a second option circuit 24 that may be set after packaging the semiconductor chip, and/or a first selection circuit 26.

The first option circuit 22 may be implemented, for example, with a fuse circuit configured to set a circuit parameter or an operation mode in a wafer test process. The fuse circuit may be cut, for example, to be programmed by laser-cutting in a wafer state.

The second option circuit 24 may provide a soldering option, an electrical fuse (e-fuse) option, or a soldering option and an e-fuse option, either or both of which may be programmed, for example, to set a circuit parameter and/or an operation mode in a package test process.

When the soldering option is used, a connecting pin, which may be exposed after packaging the semiconductor chip, may be soldered, for example, to a power source terminal or a ground terminal of a board so that a high signal or a low signal may be provided to a circuit—such as an internal circuit—of the semiconductor chip through the connecting pin. Thus, the soldering option may change an option signal after packaging the semiconductor chip.

When the e-fuse option is used, a cutting current may be provided, for example, to a fuse circuit through a connecting pin, so that a fuse included in the fuse circuit may be cut. Thus, the e-fuse option also may change an option signal after packaging the semiconductor chip.

As described above, the soldering option and/or the e-fuse option may be thought of as hardware-option methods, in which an option signal may be generated by a mechanical or physical transformation.

The second option circuit 24 may further provide a MRS option configured to generate an option signal using, for example, a software program in test equipment to supply the generated option signal into the semiconductor chip.

The first selection circuit 26 may select one signal from among a first option signal WOP1 that may be set before packaging the semiconductor chip, a second option signal POP1 that may be set after packaging the semiconductor chip, and a signal MRS1 generated by the MRS. The first selection circuit 26 may include a first logic circuit XOR1 (for example, an exclusive-OR gate), a first selector MUX1, and/or a second selector MUX2.

The first logic circuit XOR1 may serve, for example, as an "exclusive-OR" circuit so that the first logic circuit XOR1 outputs only one signal—either the first option signal WOP1 or the second option signal POP1. That is, when the first option signal WOP1 and the second option signal POP1 are the same as each other, the first logic circuit XOR1 may not have any significance. On the other hand, when the first option signal WOP1 and second option signal POP1 are different from each other, the first logic circuit XOR1 may have significance. Thus, the first logic circuit XOR1 may be configured to be activated, for example, only when the first option signal WOP1 and the second option signal POP1 are different from each other.

The first selector MUX1 may include a multiplexer. The outputted signal from the first logic circuit XOR1 and the signal MRS1 generated by the MRS may be inputted to the first selector MUX1. In response to at least one first control signal, the first selector MUX1 may output either the outputted signal from the first logic circuit XOR1 or the signal MRS1 generated by the MRS. The second selector MUX2 also may include a multiplexer. The outputted signal from the first selector MUX1 and the first option signal WOP1 may be inputted to the second selector MUX2. In response to at least one second control signal, the second selector MUX2 may output either the outputted signal from the first selector MUX1 or the first option signal WOP1. For example, the first selector MUX1 may select a signal inputted through an upper input terminal thereof when a first control signal CON1 is low and/or the first selector MUX1 may select a signal inputted through a lower input terminal thereof when the first control signal CON1 is high. Similarly, for example, the second selector MUX2 may select a signal inputted through an upper input terminal thereof when a second control signal CON2 is low and/or the second selector MUX2 may select a signal inputted through a lower input terminal thereof when the second control signal CON2 is high.

Referring to FIG. 3A, when both the first control signal CON1 and the second control signal CON2 are low, the first option signal WOP1 may be selected by the second selector MUX2 to be provided, for example, to a register REG1—such as an internal register—as a final option signal. When the first control signal CON1 is low and the second control signal CON2 is high, the second option signal POP1 may be selected by the first selector MUX1 and the second selector MUX2 to be provided to the register REG1 as the final option signal. In the alternative, when the first control signal CON1 is low and the second control signal CON2 is high, the first option signal WOP1 may be selected by the first selector MUX1 and the second selector MUX2 to be provided to the register REG1 as the final option signal. When the first control signal CON1 is high and the second control signal CON2 is low, the first option signal WOP1 may be selected by the second selector MUX2 to be provided to the register REG1 as the final option signal. When both the first control signal CON1 and the second control signal CON2 are high, the signal MRS1 outputted from the MRS may be selected by the first selector MUX1 and the second selector MUX2 to be provided to the register REG1 as the final option signal. Thus, a final option may be determined by a fuse option, a soldering option, and/or an e-fuse option.

Referring to FIG. 3B, when the first logic circuit XOR1 may be or may act as an exclusive-OR gate, the output of the first logic circuit XOR1—as well as the first control signal CON1 and the second control signal CON2—may influence the final option signal. For example, if the second control signal CON2 is low, the first option signal WOP1 may be selected by the second selector MUX2 to be provided to the register as the final option signal—independent of the output of the first logic circuit XOR1 or the first control signal CON1. When both the first control signal CON1 and the second control signal CON2 are high, the signal MRS1 outputted from the MRS may be selected by the first selector MUX1 and the second selector MUX2 to be provided to the register as the final option signal—independent of the output of the first logic circuit XOR1. When the first control signal CON1 is low and the second control signal CON2 is high, the first option signal WOP1 may be selected by the first selector MUX1 and the second selector MUX2 to be provided to the register as the final option signal—if the output of the first logic circuit XOR1 is the first option signal WOP1. In the alternative, when the first control signal CON1 is low and the second control signal CON2 is high, the second option signal POP1 may be selected by the first selector MUX1 and the second selector MUX2 to be provided to the register as the final option signal—if the output of the first logic circuit XOR1 is the second option signal POP1. Once again, the final option may be determined by the fuse option, the soldering option, and/or the e-fuse option.

Therefore, a user may reset the circuit parameter and/or the operation mode after packaging the semiconductor chip(s) that may be, for example, already set in the wafer test process by laser-cutting, by using the soldering option and/or the e-fuse option.

Figure 4:
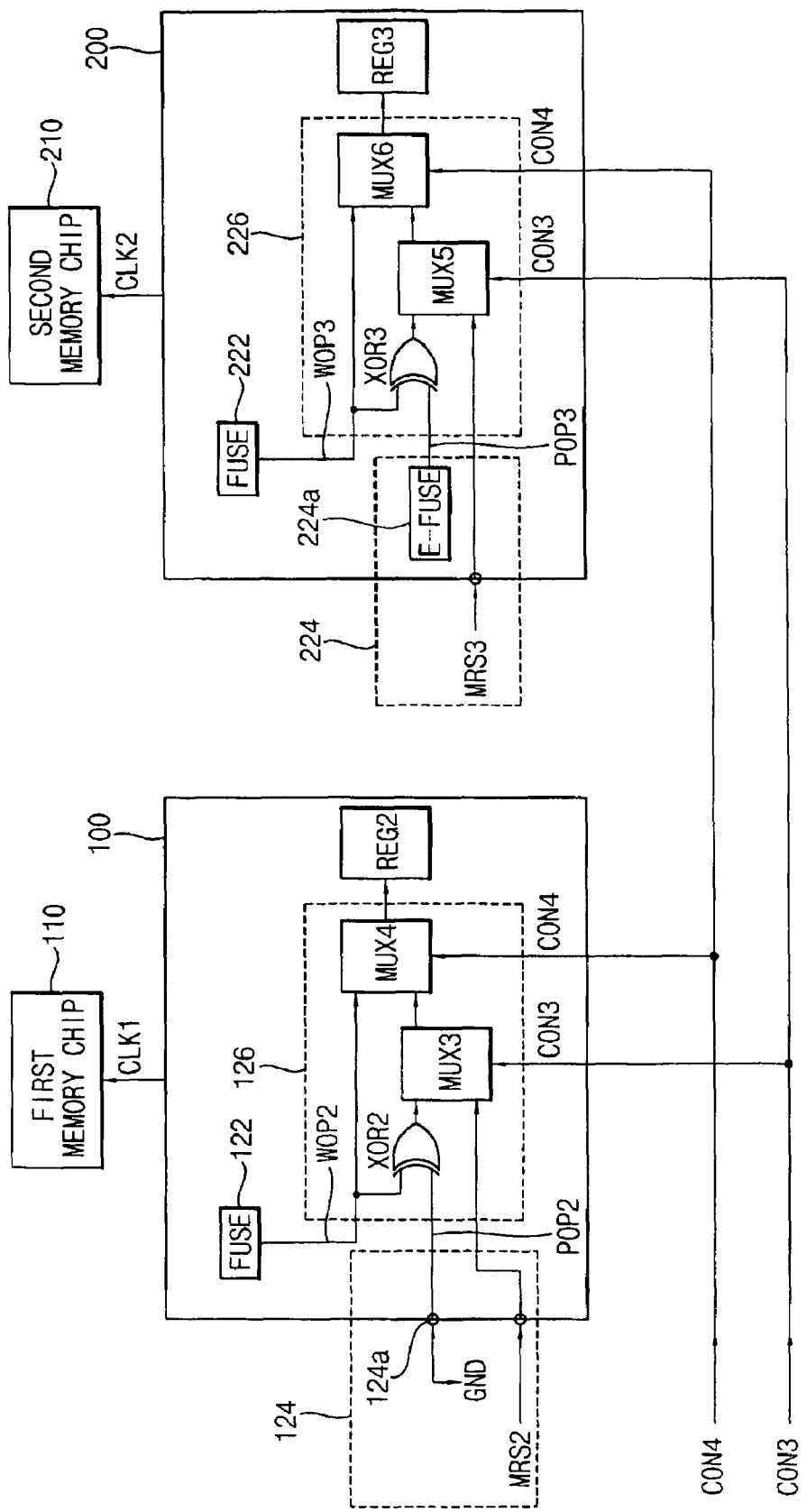
FIG. 4 is a block diagram illustrating operation of an option circuit of a semiconductor chip according to example embodiments.

FIG. 4 is a block diagram illustrating operation of an option circuit of a semiconductor chip according to example embodiments.

Referring to FIG. 4, first semiconductor chip 100 and second semiconductor chip 200, which may be connected to external test equipment (not shown) for testing first memory chip 110 and second memory chip 210, may be clock-signal-generation chips configured to provide clock signals to the first memory chip 110 and the second memory chip 210, respectively. The memory-chip test equipment may provide a first clock signal CLK1 to the first memory chip 110 via the first semiconductor chip 100, and may provide a second clock signal CLK2 to the second memory chip 210 via the second semiconductor chip 200.

For the purposes of this discussion, it may be assumed that the first semiconductor chip 100 and the second semiconductor chip 200 may be manufactured to generate clock signals having the same duty ratio. That is, first option circuit 122 and second option circuit 222 may be set to have the same option (i.e., they both may be fuse options). The first semiconductor chip 100 and the first memory chip 110 may be mounted on a first board (not shown), and the second semiconductor chip 200 and the second memory chip 210 may be mounted on a second board (also not shown). When test environments of the first and second boards may be different due to impedance deviations of circuit patterns of the first and second boards, the duty ratio of the second clock signal CLK2 may need controlling.

Hereinafter, operation of option circuits of the first semiconductor chip 100 and the second semiconductor chip 200 is illustrated when the duty ratio of the second signal CLK2 may need controlling.

An e-fuse option may be used in the second semiconductor chip 200, for example, to control the duty ratio of the second clock signal CLK2. The duty ratio may be reset, for example, by cutting an e-fuse 224a in a fourth option circuit 224. A connecting pin 124a in a third option circuit 124 of the first semiconductor chip 100 may be connected to a ground terminal GND of the first board. With the above state, a third control signal CON3 in a low state and a fourth control signal CON4 in a high state may be applied to: (1) a third selector MUX3 and a fourth selector MUX4, respectively; and/or (2) a fifth selector MUX5 and a sixth selector MUX6, respectively. A second selection circuit 126 and a third selection circuit 226 may select signals outputted from a second logic circuit XOR2 and a third logic circuit XOR3, respectively, in response to the applied third control signal CON3 and fourth control signal CON4. The signals selected by the second selection circuit 126 and the third selection circuit 226 may be provided to a second register REG2 and a third register REG3, respectively. In the first semiconductor chip 100, a third option signal WOP2 for use before packaging the first semiconductor chip 100 and the second semiconductor chip 200, which may be generated by a fuse option, may be applied to the third selector MUX3 through the second logic circuit XOR2, so that the third option signal WOP2 may be applied to the second register REG2 as a second final option signal (instead of, for example, the fourth option signal POP2 or a second mode register set signal MRS2). Thus, the first semiconductor chip 100 may generate the first clock signal CLK1 with a duty ratio corresponding to a fuse option that may be set before packaging the first semiconductor chip 100 and the second semiconductor chip 200.

In the second semiconductor chip 200, a sixth option signal POP3 for use after packaging the first semiconductor chip 100 and the second semiconductor chip 200, which may be generated by an e-fuse option, may be applied to the fifth selector MUX5 through the third logic circuit XOR3, so that the sixth option signal POP3 may be applied to the third register REG3 as a third final option signal (instead of, for example, the fifth option signal WOP3 or a third mode register set signal MRS3). Thus, the second semiconductor chip 200 may generate the second clock signal CLK2 with a duty ratio changed by the e-fuse option that may be set after packaging the first semiconductor chip 100 and the second semiconductor chip 200.

That is, the first semiconductor chip 100 and the second semiconductor chip 200 may have operation modes with different duty ratios, even though the first semiconductor chip 100 and the second semiconductor chip 200 may be operated with the same control signals CON3 and CON4.

Thus, according to example embodiments, a user may actively manage changes in test environments so that efficiency of the test equipment may be improved.

According to example embodiments, a fuse option, a soldering option, and/or an e-fuse option may be selectively controlled with a MRS option so that information may be changed with the soldering option and/or the e-fuse option even after packaging a semiconductor chip.

Even though the example embodiments adopted for test environments may be illustrated, example embodiments may be adopted for all environments under which any option may need changing, according to environments of a board, for example, on which a semiconductor chip may be mounted.

While example embodiments have been particularly shown and described, it will be understood by those of ordinary skill in the art that various changes in form and details may be made therein without departing from the spirit and scope of the present invention as defined by the following claims.

What is claimed is:

1. An option circuit of a semiconductor chip, comprising:
a first option circuit that is set before packaging the semiconductor chip to generate a first option signal;
a second option circuit that is set after packaging the semiconductor chip to generate a second option signal; and
a selection circuit configured to:
select one of the first option signal, the second option signal, and a mode register set (MRS) signal in response to at least one control signal; and
output a first selected signal as a final option signal;
wherein the selection circuit comprises:
a logic circuit configured to choose between the first option signal and the second option signal or to replace the first option signal with the second option signal;
a first selector configured to:
select one of an output signal of the logic circuit and the MRS signal in response to a first control signal; and
output a second selected signal; and
a second selector configured to:
select one of the second selected signal and the first option signal in response to at least one second control signal; and
output the first selected signal as the final option signal.

2. The option circuit of claim 1, wherein the first option circuit comprises a fuse option circuit, and
wherein a fuse in the fuse option circuit is cut by laser-cutting before packaging the semiconductor chip.

3. The option circuit of claim 1, wherein the second option circuit comprises:
a soldering option circuit that is set after packaging the semiconductor chip;
an electrical fuse (e-fuse) option circuit that is set after packaging the semiconductor chip; or
a soldering option circuit and an e-fuse option circuit that are set after packaging the semiconductor chip.

4. The option circuit of claim 1, wherein the logic circuit is or acts as an exclusive-OR gate.

5. The option circuit of claim 1, wherein the semiconductor chip is configured to provide a clock signal, and
wherein the option circuit is included in the semiconductor chip to program a duty ratio of the clock signal.

6. An option method of a semiconductor chip, comprising:
setting a first option mode of the semiconductor chip by use of a first option circuit, before packaging the semiconductor chip;
setting a second option mode of the semiconductor chip by use of a second option circuit, after packaging the semiconductor chip; and determining a final option mode of the semiconductor chip by selection of the first option mode, the second option mode, or a mode register set (MRS) mode based on at least one control signal;

wherein determining the final option mode comprises:
  choosing between the first option mode and the second option mode;
  first selecting one of an output mode of the choosing and the MRS mode in response to a first control signal; and
  second selecting one of an output of the first selecting and the first option mode in response to at least one second control signal.

7. The option method of claim 6, wherein setting the first option mode comprises laser-cutting the first option circuit in a wafer-test process.

8. The option method of claim 6, wherein setting the second option mode comprises:
  soldering an option pad in the second option circuit; or
  cutting an electrical fuse in the second option circuit.

9. The option method of claim 6, wherein setting the second option mode comprises:
  soldering an option pad in the second option circuit;
  cutting an electrical fuse in the second option circuit; or
  soldering the option pad in the second option circuit and cutting the electrical fuse in the second option circuit.

10. The option method of claim 6, wherein setting the second option mode comprises:
  soldering an option pad in the second option circuit;
  cutting an electrical fuse in the second option circuit; or
  applying an MRS signal.

11. The option method of claim 6, wherein setting the second option mode comprises:
  soldering an option pad in the second option circuit;
  cutting an electrical fuse in the second option circuit;
  applying an MRS signal;
  soldering the option pad in the second option circuit and cutting the electrical fuse in the second option circuit;
  soldering the option pad in the second option circuit and applying the MRS signal;
  cutting the electrical fuse in the second option circuit and applying the MRS signal; or
  soldering the option pad in the second option circuit, cutting the electrical fuse in the second option circuit, and applying the MRS signal.

* * * * *